United States Patent
Rouh et al.

(10) Patent No.: US 7,935,591 B2
(45) Date of Patent: May 3, 2011

(54) METHOD FOR FABRICATING PMOS TRANSISTOR AND METHOD FOR FORMING DUAL GATE USING THE SAME

(75) Inventors: Kyoung Bong Rouh, Goyang-si (KR); Choon Hwan Kim, Seongnam-si (KR); Il Cheol Rho, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 199 days.

(21) Appl. No.: 12/346,492

(22) Filed: Dec. 30, 2008

(65) Prior Publication Data
US 2010/0120240 A1  May 13, 2010

(30) Foreign Application Priority Data
Nov. 11, 2008 (KR) .................. 10-2008-0111581

(51) Int. Cl.
*H01L 21/8238* (2006.01)
(52) U.S. Cl. ............ 438/199; 257/E21.316; 438/197; 438/542; 438/565

(58) Field of Classification Search ............ 438/197, 438/199, 542, 565; 257/E21.316
See application file for complete search history.

(56) References Cited

U.S. PATENT DOCUMENTS
| | | | |
|---|---|---|---|
| 5,874,352 A * | 2/1999 | Akamine et al. | 438/565 |
| 2004/0222462 A1 | 11/2004 | Gonzalez et al. | |
| 2007/0190723 A1 | 8/2007 | Oh et al. | |

OTHER PUBLICATIONS

Kiyota et al., "Characteristics of Shallow Boron—Doped Layers in Si by Rapid Vapor—Phase Direct Doping," vol. 140(4), p. 1117(1993).*

* cited by examiner

*Primary Examiner* — Asok K Sarkar
(74) *Attorney, Agent, or Firm* — Kilpatrick Townsend & Stockton LLP

(57) ABSTRACT

Provided are a method for fabricating a PMOS transistor and a method for forming a dual gate of a semiconductor device using the same. The method for fabricating a PMOS transistor includes forming a gate insulation layer over a semiconductor substrate; forming a polysilicon layer over the gate insulation layer; and doping the polysilicon layer using a boron (B) containing gas in one of an Atomic Layer Deposition (ALD) chamber and a Chemical Vapor Deposition (CVD) chamber.

6 Claims, 4 Drawing Sheets

METHOD FOR FABRICATING PMOS TRANSISTOR AND METHOD FOR FORMING DUAL GATE USING THE SAME

CROSS-REFERENCE TO RELATED APPLICATIONS

The present application claims priority to Korean patent application number 10-2008-0111581, filed on Nov. 11, 2008, which is incorporated by reference in its entirety.

BACKGROUND OF THE INVENTION

The present invention relates to a method for fabricating a semiconductor device, and more particularly, to a method for fabricating a PMOS transistor and a method for forming a dual gate of a semiconductor device using the same.

Polysilicon is generally used as a material for forming a gate of a semiconductor device. This is because the polysilicon meets physical properties required for the gate material such as high melting point, easiness of thin film formation and line pattern formation and formability of an even surface. Conventionally, for process simplification, the gate is formed of N-type doped polysilicon in both NMOS and PMOS transistors and the PMOS transistor is therefore formed with a buried channel. However, as a design rule is decreased more and more and high power and high speed operation are required, the PMOS transistor with the buried channel represents a limitation. In order to overcome the limitation, a dual gate process is widely used in recent, in which N-type doped polysilicon is used in an NMOS region and P-type doped polysilicon is used in a PMOS region.

By changing the PMOS transistor into a surface channel type, current on/off ratio and role off property of threshold voltage of the short channel are improved. It is necessary to use P+ doped polysilicon as the gate material instead of N+ doped polysilicon to form the PMOS transistor in the surface channel structure.

Conventionally, in order to form the gate of the PMOS transistor, a polysilicon layer is, after deposition of the polysilicon layer, doped with P-type impurities by ion implantation or plasma doping. However, the method of doping the polysilicon layer by the ion implantation takes more than 30 minutes per a wafer for implanting a large amount of P-type dopant and has a problem of low mass productivity. In the case of the plasma doping, although the mass productivity is ensured, a large amount of P-type dopant piled on the polysilicon layer together with being diffused into the polysilicon layer. Boron (B) not implanted into the polysilicon layer but piled on the polysilicon layer promotes growth of an oxide layer to form a thin oxide layer between the polysilicon layer and a tungsten layer.

Such oxide layer formed between the polysilicon layer and the tungsten layer causes ring oscillator delay. Also, in the case of the plasma doping, it is necessary to purchase a new plasma doping equipment of high price.

SUMMARY OF THE INVENTION

Embodiments of the present invention are directed to a method for fabricating a PMOS transistor which can effectively dope a polysilicon layer utilizing existing equipments without purchasing new equipments, and a method of forming a dual gate using the same.

In one embodiment, a method for fabricating a PMOS transistor includes: forming a gate insulation layer over a semiconductor substrate; forming a polysilicon layer over the gate insulation layer; and doping the polysilicon layer using a boron (B) containing gas in one of an Atomic Layer Deposition (ALD) chamber and a Chemical Vapor Deposition (CVD) chamber.

In another embodiment, a method for fabricating a dual gate of a semiconductor device includes: forming a gate insulation layer over a semiconductor substrate; forming an N-type doped polysilicon layer over the gate insulation layer; forming a photoresist layer which exposes a PMOS region over the polysilicon layer; doping the polysilicon layer in the PMOS region to P-type using a boron (B) containing gas in one of an Atomic Layer Deposition (ALD) chamber and a Chemical Vapor Deposition (CVD) chamber; forming a metal electrode layer over the polysilicon layer after removing the photoresist pattern; forming a hard mask defining regions to be formed with NMOS and PMOS gates over the metal electrode layer; and forming the gates of NMOS transistor and PMOS transistor by patterning the metal electrode layer, the polysilicon layer and the gate insulation layer using the hard mask.

DESCRIPTION OF SPECIFIC EMBODIMENTS

Hereinafter, an exemplary embodiment of the present invention will be described with reference to accompanying drawings. The embodiment is for illustrative purposes only, and the scope of the present invention is not limited thereto.

Figure 1:
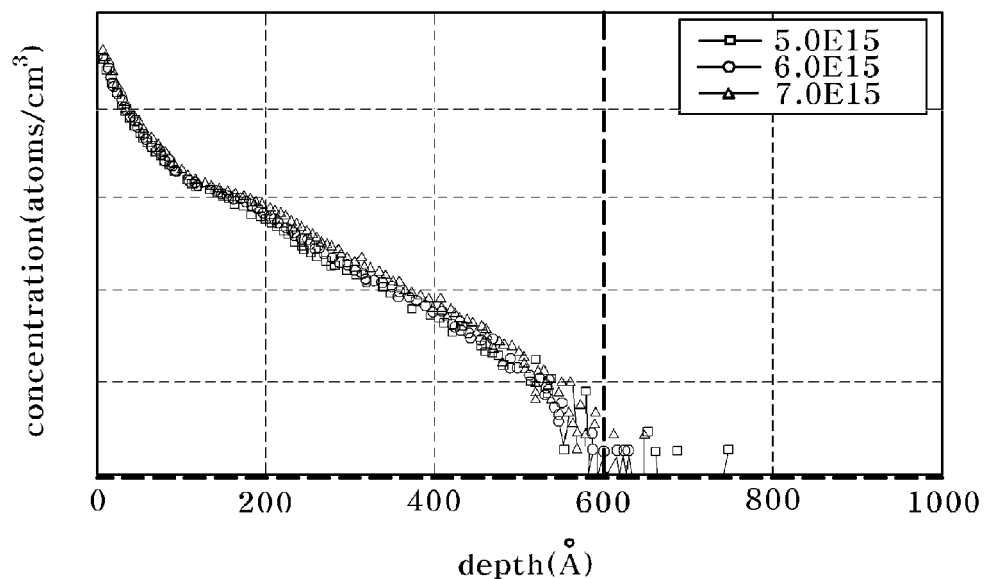
FIG. 1 is a graph showing a SIMS profile of a polysilicon layer doped with boron (B) ion using a plasma doping.

FIG. 1 is a graph showing a SIMS profile of a polysilicon layer doped with boron (B) ion using a plasma doping and shows a doping profile according to a depth of a polysilicon layer in cases that 11 B ions are implanted at a concentration of $5.0 \times 10^{15}$ ions/cm$^3$, $6.0 \times 10^{15}$ ions/cm$^3$ and $7.0 \times 10^{15}$ ions/cm$^3$, respectively.

It can be seen that the boron ions have reached to a depth of about 600 Å in all of the three cases using a plasma doping.

Figure 2:
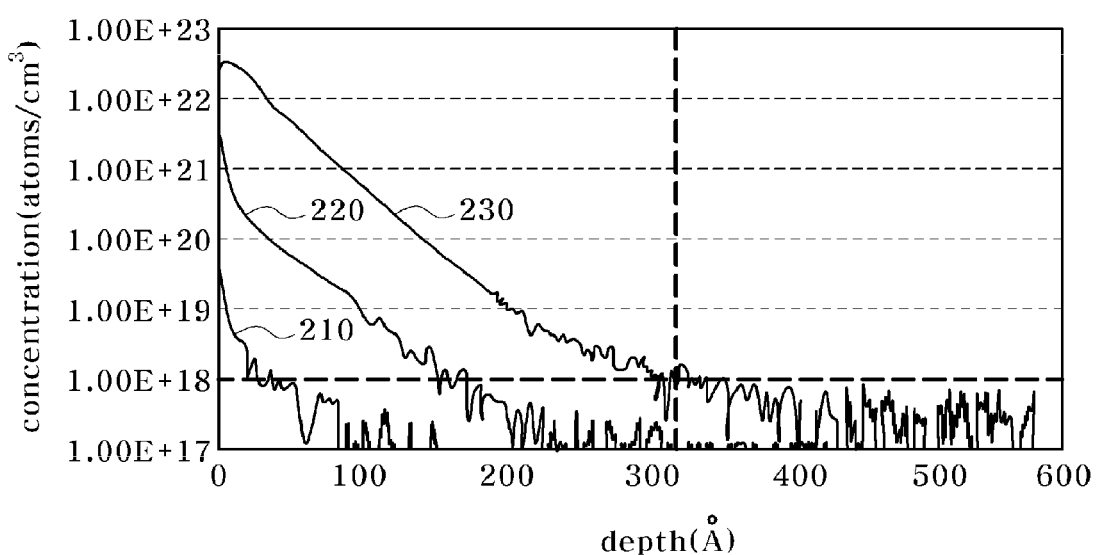
FIG. 2 is a graph showing a SIMS profile of a polysilicon layer doped with boron (B) ion using Atomic Layer Deposition (ALD) and Chemical Vapor Deposition (CVD) equipments.

FIG. 2 is a graph showing a SIMS profile of a polysilicon layer doped with boron (B) ion using Atomic Layer Deposition (ALD) and Chemical Vapor Deposition (CVD) equipments.

A reference numeral "210" indicates a case of doping a bare wafer, "220" indicates a case of soaking for 60 seconds at a temperature of 295° C. using $B_2H_6$ gas in an ALD equipment, and "230" indicates a case of soaking for 60 seconds at a temperature of 375° C. using $B_2H_6$ gas in an Advanced Nucleation Layer (ANL) equipment which is a kind of CVD equipment.

As shown, it can be seen that an arrival depth of a dopant showing a concentration of $1 \times 10^{15}$ ions/cm$^3$ is 320 Å, which is decreased by 280 Å as compared to the plasma doping shown in FIG. 1. Such decrease in the arrival depth of the dopant means that a possibility that the boron ion gets through the gate oxide layer to be diffused upon subsequent thermal process is lower than that of the plasma doping.

The present invention suggests a method for forming a gate of a PMOS and a dual gate of a transistor by doping boron (B) into a polysilicon layer using $B_2H_6$ gas soaking in an ALD or CVD chamber.

Figure 3:
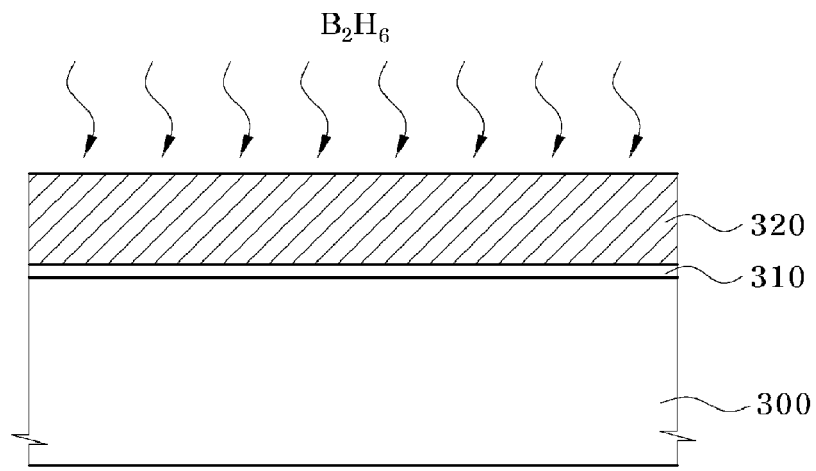
FIG. 3 is a cross-sectional view illustrating a method for fabricating a PMOS transistor in accordance with an embodiment of the present invention.
Figure 4:
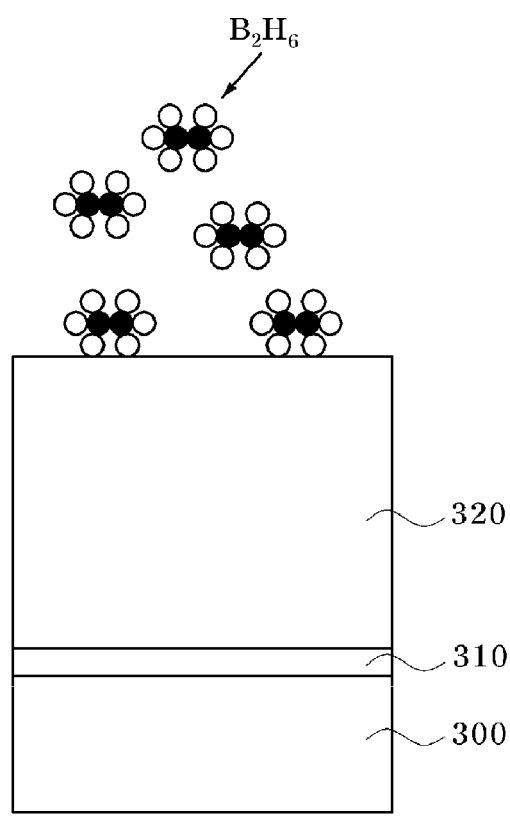
FIGS. 4 and 5 are cross-sectional views illustrating a mechanism of doping a polysilicon layer using $B_2H_6$.
Figure 5:
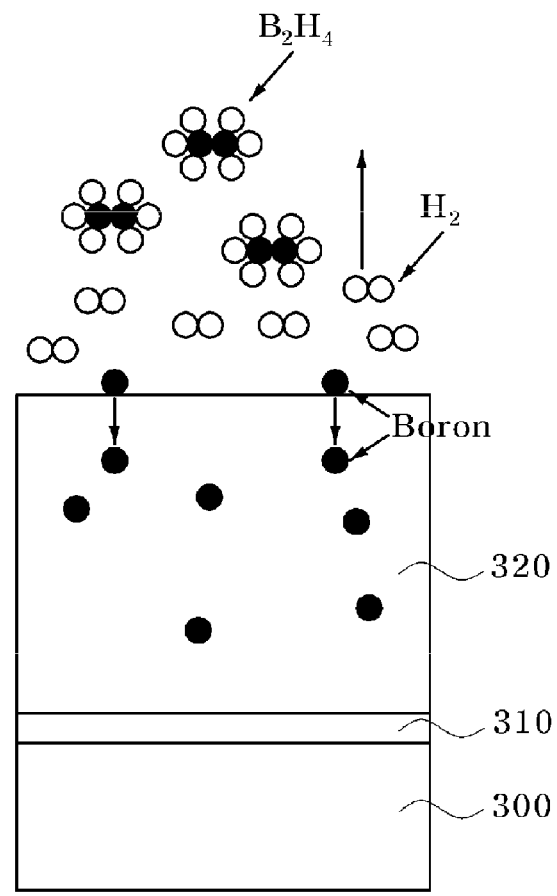

FIG. 3 is a cross-sectional view illustrating a method for fabricating a PMOS transistor in accordance with an embodiment of the present invention and FIGS. 4 and 5 are cross-sectional views illustrating a mechanism of doping a polysilicon layer using $B_2H_6$.

Referring to FIG. 3, a gate insulation layer 310 is formed over a semiconductor substrate 300. The semiconductor substrate 300 may be e.g. a P-type silicon substrate. The gate insulation layer 310 may be formed by oxidating a surface of the semiconductor substrate, or formed by depositing an oxide layer, a nitride layer or an oxynitride (SiON) layer by CVD, or formed in an ONO structure by sequentially depositing oxide layer/nitride layer/oxide layer.

A polysilicon layer 320 is deposited over the gate insulation layer 310 by a predetermined thickness to form a gate conductive layer.

Next, in order to form a gate of a PMOS transistor, the polysilicon layer 320 is doped with P-type dopant. Specifically, the semiconductor substrate formed with the polysilicon layer 320 is loaded in an ALD chamber or a CVD chamber and a gas containing boron (B) such as $B_2H_6$ gas is then injected as a nucleation gas into the chamber. At this time, a temperature of the ALD or CVD chamber is about 50 to 450° C., a soaking time is about 10 to 180 seconds and a flow rate of the $B_2H_6$ gas is about 50 to 400 sccm.

By injecting the $B_2H_6$ gas into the chamber under the aforementioned condition after loading the semiconductor substrate formed with the polysilicon layer 320 in the ALD chamber, as shown in FIGS. 4 and 5, the $B_2H_6$ gas is decomposed into boron (B) atom and hydrogen gas ($H_2$) by thermal energy. At this time, the decomposed hydrogen gas ($H_2$) is volatilized and the boron (B) atom is diffused into the polysilicon layer, thereby doping the polysilicon layer 320 with boron (B).

From the result of observing photographs before and after doping the polysilicon layer with boron (B) using ALD or CVD, it can be seen that the polysilicon layer is doped without stacking of silicon-boron compound ($SiB_x$) over the surface of the polysilicon layer in both the case of soaking with $B_2H_6$ gas in the ALD chamber and the case of soaking with $B_2H_6$ gas in the CVD chamber. The fact that the silicon-boron compound ($SiB_x$) is not stacked over the surface of the polysilicon layer means that there is no loss of boron (B) of the polysilicon layer by removal of the silicon-boron compound ($SiB_x$) in subsequent cleaning process or photoresist strip process.

Next, a method for forming a dual gate of a semiconductor device in accordance with an embodiment of the present invention will be described.

Figure 6:
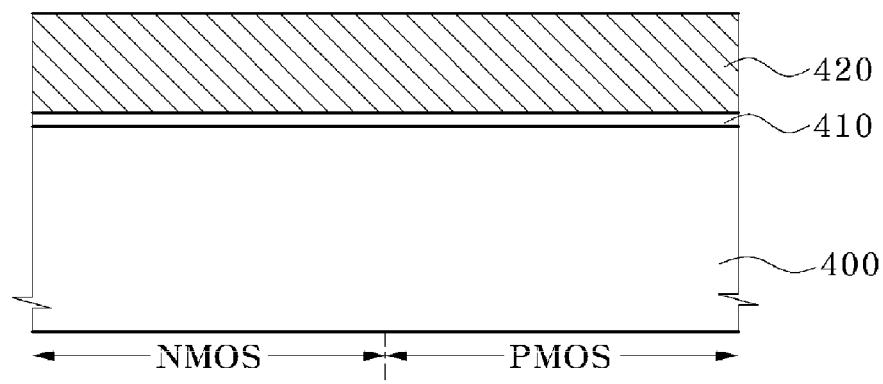
FIGS. 6 to 8 are cross-sectional views illustrating a method for forming a dual gate of a semiconductor device in accordance with an embodiment of the present invention.
Figure 7:
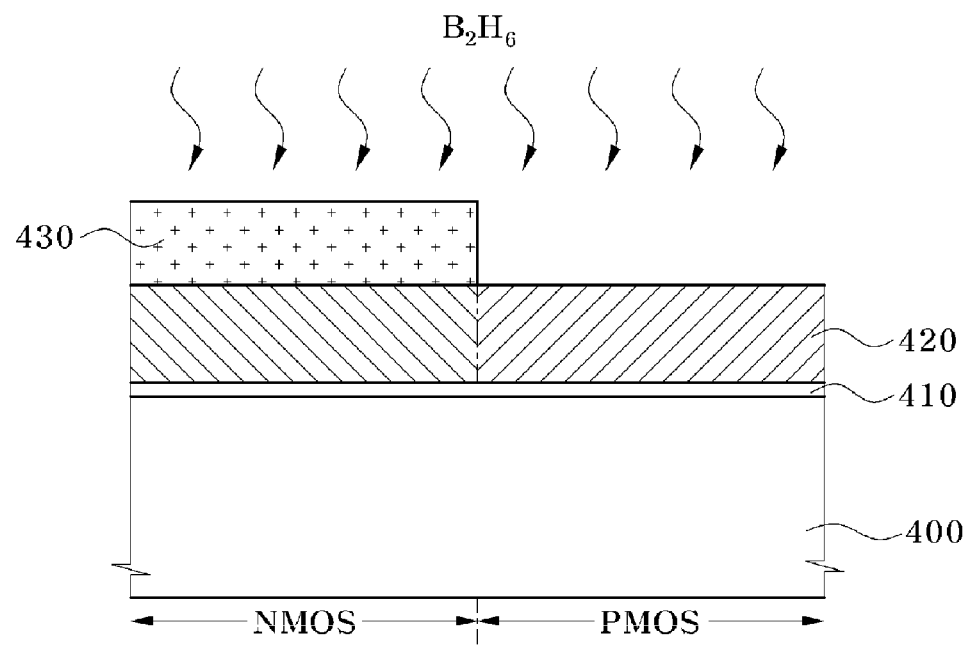
Figure 8:
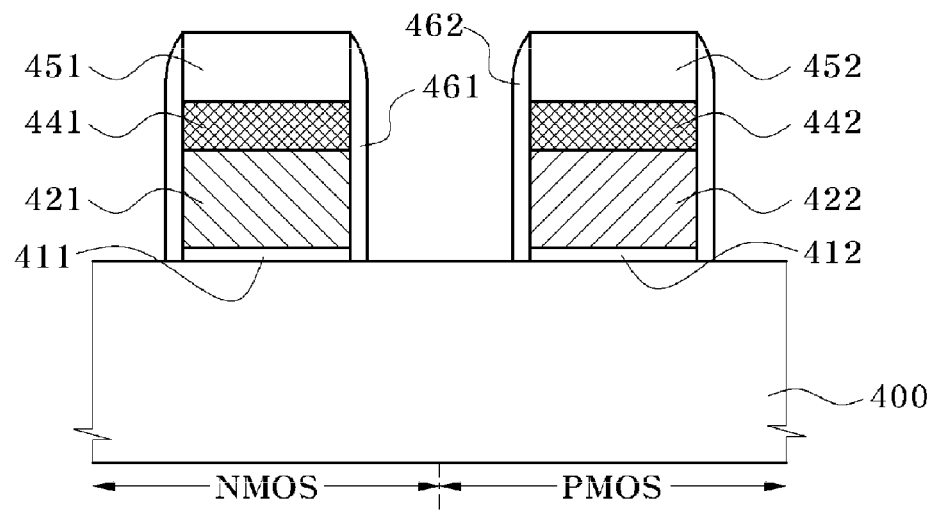

FIGS. 6 to 8 are cross-sectional views illustrating a method for forming a dual gate of a semiconductor device in accordance with an embodiment of the present invention.

Referring to FIG. 6, an isolation layer (not shown) for defining an active region and an inactive region is formed in a semiconductor substrate 400 by a conventional isolation method. A well (not shown) is formed in the semiconductor substrate 400 through ion implantation and annealing processes. After that, for example, an oxide layer is grown over the semiconductor substrate to form a gate insulation layer 410. The gate insulation layer 410 may be formed of a silicon oxide ($SiO_2$) layer or a high-k dielectric layer such as hafnium oxide (HfO).

Next, a polysilicon layer 420 for forming a gate electrode is deposited. The polysilicon layer 420 may be formed of a doped polysilicon layer or a un-doped polysilicon layer. In the present invention, an N-type doped polysilicon layer is formed. The polysilicon layer 420 may be formed to a thickness, though it may be varied as the kind of the device, of 500 to 800 Å e.g. in a case of a transistor of a DRAM of a 44 nm technology.

Referring to FIG. 7, to form PMOS and NMOS gates by performing masking only one time for the process simplification in mass production, a polysilicon layer doped to N-type is formed over the entire surface and then counter doping a PMOS region with P-type dopant. In a case that the polysilicon is un-doped, N-type dopants are entirely injected to dope the polysilicon to N-type. After that, a photoresist pattern 430 for defining a region to be formed with P-type gate electrode is formed over the N-type doped polysilicon layer 420. The photoresist pattern 430 is formed in such a shape that exposes the region to be formed with a PMOS transistor and covers the region to be formed with an NMOS transistor.

Next, the polysilicon layer in the PMOS region is doped with P-type dopant using the photoresist pattern 430 as a mask. Specifically, the semiconductor substrate formed with the polysilicon layer 420 and the photoresist pattern 430 is loaded in an ALD chamber or a CVD chamber and a gas containing boron (B) such as $B_2H_6$ gas is then injected into the chamber to soak the polysilicon layer 420 in the PMOS region. At this time, a temperature of the ALD or CVD chamber is about 50 to 450° C., a soaking time is about 10 to 180 seconds and a flow rate of the $B_2H_6$ gas is about 50 to 400 sccm.

Referring to FIG. 8, the photoresist pattern is removed and the semiconductor substrate is then annealed at a predetermined temperature in order that diffusion of the impurities is sufficiently performed in an entire gate region. In this annealing process, crystallization of the polysilicon layer is made.

Next, cleaning process for removing a native oxide layer formed over the polysilicon layer 421, 422 is performed. Subsequently, tungsten (W) or tungsten silicide (WSi) is deposited over the polysilicon layer to form a metal electrode layer 441, 442. A nitride layer is deposited over the metal electrode layer and then patterned to form a hard mask layer 451, 452. The metal electrode layer 441, 442 and the polysilicon layer 421, 422 are sequentially patterned using the hard mask layer 451, 452 as a mask to form gate pattern in the NMOS region and the PMOS region respectively. Subsequently, insulation layer spacers 461, 462 are formed at sidewalls of the gate pattern. The insulation layer spacers 461, 462 may be formed in such a manner that e.g. an oxide layer or a nitride layer is deposited over the resultant formed with the gate pattern and then etched back.

As is apparent from the above description, in the method for forming a PMOS transistor and a dual gate of the present invention, the polysilicon layer is doped by soaking using boron containing gas and thermal energy in ALD or CVD chamber instead of ion implantation or plasma doping. According to the present invention, it is possible to the phenomenon that boron (B) ion piles on the surface of the polysilicon layer and also prevent that an oxide layer is formed between the polysilicon layer and the tungsten layer. Also, since an ALD equipment or a CVD equipment which is largely used in the semiconductor fabrication process is used in the present invention, it is possible to save the cost according to new purchase of a plasma doping equipment.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a dual gate of a semiconductor device, the method comprising:
    forming a gate insulation layer over a semiconductor substrate;
    forming an N-type doped polysilicon layer over the gate insulation layer;
    forming a photoresist layer which exposes a PMOS region over the polysilicon layer;
    doping the polysilicon layer in the PMOS region to P-type using a boron (B) containing gas in one of an Atomic Layer Deposition (ALD) chamber and a Chemical Vapor Deposition (CVD) chamber;
    forming a metal electrode layer over the polysilicon layer after removing the photoresist pattern;
    forming a hard mask defining regions to be formed with NMOS and PMOS gates over the metal electrode layer; and
    forming the gates of NMOS transistor and PMOS transistor by patterning the metal electrode layer, the polysilicon layer and the gate insulation layer using the hard mask.

2. The method of claim 1, wherein, in the doping of the polysilicon layer in the PMOS region to P-type, a temperature in the chamber is 50 to 450° C.

3. The method of claim 1, wherein the doping of the polysilicon layer in the PMOS region to P-type is implemented for 10 to 180 seconds.

4. The method of claim 1, wherein, in the doping of the polysilicon layer in the PMOS region to P-type, a flow rate of the boron containing gas is 50 to 400 sccm.

5. The method of claim 1, wherein, in the doping of the polysilicon layer in the PMOS region to P-type, the boron containing gas is $B_2H_6$ gas.

6. The method of claim 1, wherein the method further comprises, after forming the gates of the NMOS and PMOS transistors, forming insulation layer spacers at sidewalls of the gates of the NMOS and PMOS transistors.

* * * * *